United States Patent [19]

Lind

[11] Patent Number: 4,528,256
[45] Date of Patent: Jul. 9, 1985

[54] ELECTROPHOTOGRAPHIC RECORDING MATERIAL WITH CONDENSATION PRODUCT

[75] Inventor: Erwin Lind, Wiesbaden, Fed. Rep. of Germany

[73] Assignee: Hoechst Aktiengesellschaft, Frankfurt am Main, Fed. Rep. of Germany

[21] Appl. No.: 599,802

[22] Filed: Apr. 13, 1984

[30] Foreign Application Priority Data

Apr. 15, 1983 [DE] Fed. Rep. of Germany ....... 3313798

[51] Int. Cl.³ .......................... G03G 5/09; G03G 5/06
[52] U.S. Cl. ...................... 430/83; 430/56; 430/49
[58] Field of Search .................... 430/56, 83

[56] References Cited

U.S. PATENT DOCUMENTS 3,935,009  1/1976  Crommentuyr et al. ......... 430/83 X

FOREIGN PATENT DOCUMENTS 1058836  11/1959  Fed. Rep. of Germany.
1217785  1/1962   Fed. Rep. of Germany.
1120875  7/1962   Fed. Rep. of Germany.
1621478  4/1971   Fed. Rep. of Germany.
52-60138 5/1977   Japan ........................... 430/83

Primary Examiner—Roland E. Martin
Attorney, Agent, or Firm—Schwartz, Jeffery, Schwaab, Mack, Blumenthal & Evans

[57] ABSTRACT

The invention describes an electrophotographic recording material composed of an electrically conductive support layer, which is suitable in particular for the production of printing forms or printed circuits, and of a photoconductive layer comprised of an organic photoconductor, a binder and a sensitizer. The photoconductive layer additionally contains a condensation product of benzophenone-2-carboxylic acid and a dialkyl aniline, for example, benzophenone-2-carboxylic acid and diethyl aniline or 4'-methylbenzophenone-2-carboxylic acid and diethyl aniline.

18 Claims, 1 Drawing Figure

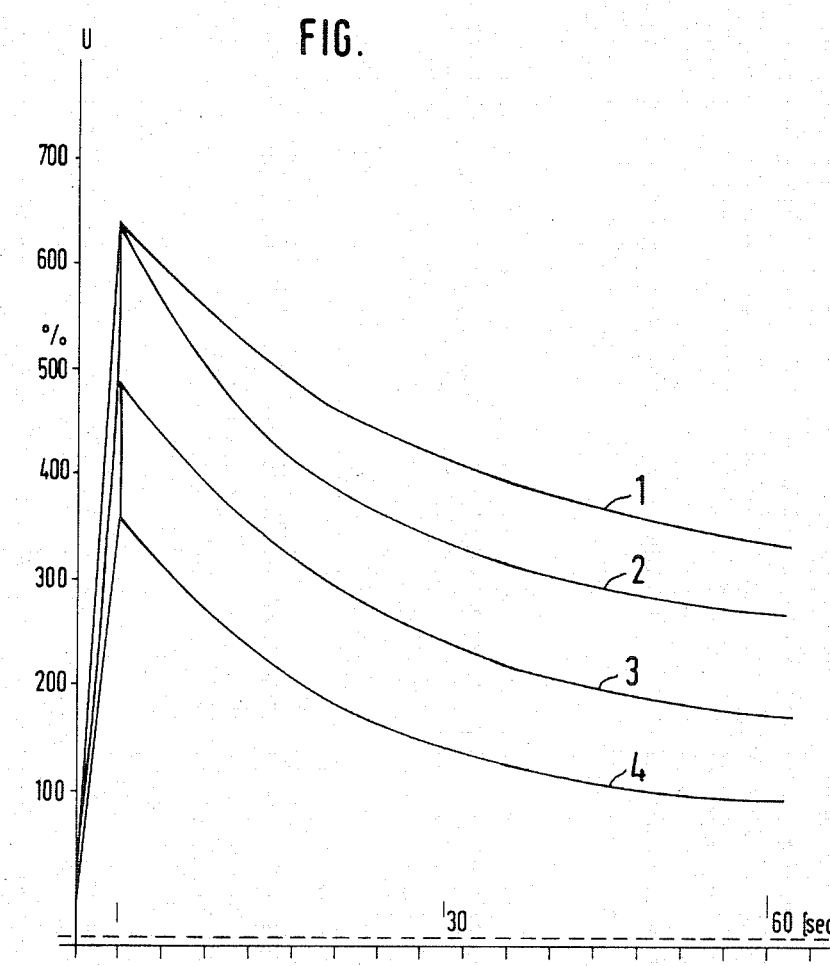

ELECTROPHOTOGRAPHIC RECORDING MATERIAL WITH CONDENSATION PRODUCT

BACKGROUND OF THE INVENTION

The present invention relates to an electrophotographic recording material composed of an electrically conductive layer support, which is suitable, in particular, for the production of printing forms or printed circuits, and of a photoconductive layer comprised of an organic photoconductor, a binder and a sensitizer.

Recording materials for reproduction by electrophotographic means are known. They are, for example, employed in electrophotographic processes in which a photoconductive layer which consists of or contains organic or inorganic photoconductors, is electrostatically charged in the absence of actinic radiation and subsequently imagewise exposed. Thereby, the electric charge flows off in the areas which are struck by light, and the image thus produced is made visible by means of a developer, is transferred, if appropriate, and is fixed.

Processes for the production of electrophotographic recording materials and for the filmless production of printing forms are widely used today. Apart from a good sensitivity to light, the photoconductive layer must exhibit low discharge in the dark and a low sensitivity to pre-exposure, and the known layers do not always possess these properties to a sufficient degree.

A great number of organic compounds which possess more or less satisfying photoconductor properties and which can be used in the production of layers for electrophotographic purposes are known. Compounds which possess less satisfying photoconductor properties include, for example, the condensation products of an aromatic o-dicarboxylic acid anhydride and an aromatic amine which are disclosed by German Pat. No. 12 17 785 (equivalent to U.S. Pat. No. 3,290,146). Compounds which possess good photoconductor properties include, for example, the oxadiazole derivatives described in German Pat. No. 10 58 836 (equivalent to U.S. Pat. No. 3,189,447).

It is also known to use mixtures of several photoconductors in electrophotographic recording materials. For example, German Pat. No. 12 17 785 describes the addition of a substituted oxadiazole to a photoconductive layer comprising a condensation product of phthalic acid anhyride and diethyl aniline. This improves the light sensitivity of the layer.

In the production of printing forms or printed circuits by electrophotographic means it is of crucial importance that in addition to a good light sensitivity the photoconductive layer also possesses good resolution properties and allows for a correct gradual reproduction of screen density values of screened images. In the production of printing forms, process cameras are employed which, due to a special lens, make it possible to expose even large formats of, for example, 680 mm $\times$ 500 mm, in such a way that even in the marginal zones fine structures, such as thin lines or screen dots, are exactly reproduced. To ensure a sharp image reproduction, the light beams falling in through the lens have to be limited by a shutter, which makes longer exposure times necessary. The exposure times employed in current practice vary between about 30 and 50 seconds. This means that during this time the charge must not flow off in the non-exposed areas, i.e., a photoconductor layer suitable for the production of high-quality printing forms must not be conductive in the dark.

Furthermore, when printing forms are produced by electrophotographic means, the photoconductor layer should be soluble in aqueous-alkaline solvents, which requires the use of appropriate binders.

When the highly light-sensitive oxadiazoles are used in combination with alkali-soluble binders, it is found, however, that discharge in the dark occurs to such an extent that, after exposure by means of a process camera, it is no possible to develop fine lines and screen dots.

SUMMARY OF THE INVENTION

It is therefore an object of the present invention to provide an electrophotographic recording material comprising a photoconductive layer which has only low conductivity in the dark. Another object of the present invention is to provide an electrophotographic recording material as above wherein the photoconductive layer has a significantly reduced sensitivity to pre-exposure.

Still another object of the present invention is to provide an electrophotographic recording material with a reduced discharge in the dark of the photoconductive layer so that the toner images obtained by the subsequent application of toner are rich in contrast and possess a high marginal definition.

Yet another object of the present invention is to provide an electrophotographic recording material as above which may be produced by simple means, using, for example, inexpensive, commercially available substances or substances which can be produced employing simple processes.

In accomplishing the foregoing objects, there has been provided in accordance with the present invention an electrophotographic recording material which comprises an electrically conductive support layer and a photoconductive layer applied thereto, wherein the photoconductive layer comprises an organic photoconductor, a binder, a sensitizer, and a condensation product of a benzophenone-2-carboxylic acid and a dialkyl aniline. The dialkyl aniline preferably comprises an alkyl group having from 1 to 4 carbon atoms, and may particularly be dimethyl aniline or diethyl aniline. The condensation product may also comprise 4'-methylbenzophenone-2-carboxylic acid. The sensitizer may comprise a mixture Astrazone Orange R (C.I. 48 040) with either Brilliant Green (C.I. 42 040) or a Rhodamine dyestuff. The binder may comprise a high molecular substance which is soluble in aqueous and alcoholic solvent systems, and in particular comprises a copolymer of styrene and maleic acid anhydride or phenol resin. The photoconductor layer preferably comprises an oxadiazole derivative.

Further object, features and advantages of the present invention will become apparent from the detailed description of preferred embodiments which follows, when considered together with the attached figure.

BRIEF DESCRIPTION OF THE DRAWING

The FIGURE of drawing illustrates the advantage of the present invention in terms of the significantly reduced discharge of the photoconductive layer.

DETAILED DESCRIPTION OF PREFERRED EMBODIMENTS

The present invention provides an electrophotographic recording material composed of an electrically conductive layer support, which is particularly suitable for the production of printing forms or printed circuits, and of a photoconductive layer comprised of an organic photoconductor, a binder and a sensitizer, wherein the photoconductive layer additionally contains a condensation product of a benzophenone-2-carboxylic acid and a dialkyl aniline. The photoconductive layer preferably contains a condensation product of benzophenone-2-carboxylic acid and diethyl aniline.

In this way, an electrophotographic recording material is made available, which exhibits a good sensitivity to light, i.e., the discharge under light of the photoconductor layer corresponds to that of a layer which does not contain a condensation product, while its conductivity in the dark and sensitivity to pre-exposure are substantially reduced. It has been found that the condensation product of this invention exhibits only a low photoconductivity, and it surprisingly possesses the property of maintaining those charge carriers in the photoconductive layer which do not recombine.

The condensation products can be easily prepared. Their condensation is performed in an acid medium, preferably in acetic acid anhydride and proceeds smoothly and with a good yield. Apart from benzophenone-2-carboxylic acid, its alkyl-substituted, preferably lower alkyl-substituted derivatives, in particular 4'-methyl-benzophenone-2-carboxylic acid, are suitable.

Dialkyl anilines which can be used with particular advantage for the purposes of the invention are those having 1 to 4 carbon atoms in the alkyl group. Preferably, dimethyl aniline and diethyl aniline are employed.

Suitable organic photoconductors are those which are described in German Pat. No. 10 58 836, and which are oxadiazole derivatives, as mentioned above. Further suitable oxazole derivatives are described in German Pat. No. 11 20 875 (equivalent to U.S. Pat. No. 3,257,203); triphenylamine derivatives, triphenylmethane derivatives, more highly condensed aromatic compounds, such as anthracene, benzo-condensed heterocyclic compound, pyrazoline derivatives, hydrazone derivatives, imidazole derivatives or triazole derivatives can also be employed. Preferably, oxadiazoles, and in particular 2,5-bis(4'-diethylaminophenyl)-1,3,4-oxadiazole, are used.

Varying mixing ratios of the organic photoconductor and the condensation product according to this invention are possible. Preferably, the mixing ratios vary between about 1:1 and 5:1 parts by weight.

Surprisingly, it has been found that a portion of the relatively expensive photoconductor, for example, of the oxadiazole, can be replaced by the relatively inexpensive condensation products of this invention, without the sensitivity to light of the photoconductive layer being adversely affected. The degree of substitution or replacement also depends on the employed sensitizers and can be up to 50 percent. Due to a reduction of the discharge in the dark of the photoconductive layer, the charge contrast between the image areas and the non-image areas, which have been discharged by exposure, is increased, so that the toner images obtained by the subsequent application of toner are rich in contrast and possess a high marginal definition. This is of particular advantage in the production of printing forms or printed circuits, because in this case not only an optically perfect image, but also resistance to developer and etching is required.

Suitable binders for the photoconductive layer include, for example: balsam resins, colophony, shellac, and synthetic resins, such as colophony-modified phenolic resins and other resins containing an increased amount of colophony, coumarone resins, indene resins and the substances known under the collective name of "synthetic resins for paints and varnishes". According to the "Kunststofftaschenbuch" (Plastics Paperback) by Saechtling-Zebrowski, 11th edition (1955), pages 212 et seq., these synthetic resins for paints and varnishes include modified natural substances, such as cellulose ethers, polymers, such as vinylpolymers, for example, polyvinyl chloride, polyvinylidene chloride, polyvinyl acetate, polyvinyl acetals, polyvinyl ethers, copolymers of vinyl chloride, vinyl acetate and maleic acid, polyacrylates, polymethacrylates, and also polystyrene and copolymers, p.e., of styrene and maleic acid anhydride, isobutylene, chlorinated rubber, polycondensates, for example, polyesters, such as phthalate resins, alkyd resins, maleate resins, maleic acid-colophony mixed esters of higher alcohols, phenolformaldehyde resins, colophony-modified phenolformaldehyde condensates, urea-formaldehyde resin, melamine-formaldehyde condensates, aldehyde resins, ketonic resins, xylene-formaldehyde resins, polyamides and polyerethanes. Phthalic acid esters, such as terephthalic acid or isophthalic acid ethylene glycol polyesters and polyolefins, such as low-molecular weight polyethylene and propylene, are suitable for this purpose.

With regard to their film-forming properties and adhesive strength, the resins are preferably employed as binders. Their selection is determined by their film-forming and electrical properties, their adhesion to the layer support and, in particular, by their solubility properties. For the industrial production of printing forms and printed circuits, those binders are especially suitable which are soluble in aqueous and alcoholic solvent systems, to which acids or alkalis can be added, if appropriate. For physiological and safety reasons, aromatic or aliphatic, easily combustible solvents are not used. Thus, suitable binders are high-molecular substances which carry alkali-solubilizing groups. Examples of such groups are acid groups, anhydride groups, carboxyl groups, phenol groups, sulfoacid groups, sulfonamide groups or sulfonimide groups. Binders with high acid numbers are preferably employed, for they are particularly readily soluble in alkaline-aqueous-alcoholic solvent systems. Copolymers with anhydride groups can also be successfully employed.

Copolymers of styrene and maleic acid anhydride, such as Scripset ® by Monsanto, USA, are particularly suitable; phenolic resins, such as Alnovol ® by Hoechst AG, Germany, have also proved to be suitable.

It is known to use a broad variety of dyestuffs of different categories of compounds as sensitizers, in order to extend the range of spectral sensitivity up to 650 nm. The following are examples of effective compounds which are listed in the Dyestuff Tables (Farbstofftabellen) by Schultz (7th edition, 1 volume, 1931): Triarylmethane dyestuffs, such as Brillant Green (No. 760, p. 314, C.I. 24040), Victoria Blue B (No. 822, p. 347), Methyl Violet (No. 783, p. 327), Crystal Violet (No. 785, p. 329), Acid Violet 6B (No. 831, p. 351); xanthene dyestuffs, and among these Rhodamines, such as Rhodamine B (No. 864, p. 365), Rhodamine 6G (No.

866, p. 366), Rhodamine G extra (No. 865, p. 366), Sulforhodamine B (No. 863, p. 364) and Fast Acid Eosin G (No. 870, p. 368), and also phthaleins, such as Eosin S (No. 883, p. 375), Eosin A (No. 881, p. 374), Erythrosin (No. 886, p. 376), Phloxin (No. 890, p. 378), Rose Bengale (No. 889, p. 378) and Fluorescein (No. 880, p. 373); thiazine dyestuffs, such as Methylene Blue (No. 1,038, p. 449); acridine dyestuffs, such as Acridine Yellow (No. 901, p. 383), Acridine Orange (No. 908, p. 387) and Trypaflavin (No. 906, p. 386); quinoline dyestuffs, such as Pinacyanole (No. 924, p. 396) and Cryptocyanine (No. 927, p. 397); quinone dyestuffs and ketone dyestuffs, such as Alizarine (No. 1,141, p. 449), Alizarine Red S (No. 1,145, p. 502) and quinizarine (No. 1,148, p. 504). Cyanine dyestuffs, such as Astrazone Yellow 3G (C.I. 48 055), Astrazone Yellow 5G (C.I. 48065) or Basic Yellow 52 115 (C.I. 48 060); furthermore Astrazone Orange 3R (C.I. Basic Orange 27), Astrazone Yellow 7GLL (C.I. Basic Yellow 21), Astrazone Yellow GRL (C.I. Basic Yellow 29), and Astra Yellow R (C.I. Basic Yellow 44) are also used. Astrazone Orange R (C.I. 48 040) and Astrazone Orange G (C.I. 48 035) are particularly suitable. In particular 0.001 to 0.1 part by weight of dyestuff is employed per 1 part by weight of photoconductor. The thickness of the photoconductive layer preferably is from about 2 to 10 μm.

Suitable supports for the photoconductive layers are, for example, foils of metal, such as aluminum, zinc, copper, sheets of cellulose products, such as paper, cellulose hydrate, cellulose esters, e.g. cellulose acetate, cellulose butyrate, or films of plastics, such as polyolefins, e.g., polyethylene, polypropylene, polyvinyl compounds, e.g., polyvinyl chloride, polyvinylidene chloride, polystyrene, polyacrylic compounds, e.g., polyacrylonitrile, polymethacrylate, polyesters, e.g., polyterephthalic acid ester, polyamides and polyurethanes.

If paper is used as the layer support, an appropriate pretreatment to prevent the penetration of coating liquid is recommended. Films, which are provided with a metal, e.g., aluminum, coating by lamination or vapor deposition, are also suitable layer supports.

In the production of printing forms or printed circuits by electrophotographic means, it is advantageous to use the well-known materials as layer supports, such as plates of aluminum, zinc, magnesium, copper or multimetal plates.

Surface-treated aluminum plates have proved to be particularly suitable. The surface treatment comprises a mechanical or electrochemical roughening which can be optionally followed by an anodic oxidation and treatment with polyvinylphosphonic acid in accordance with German Offenlegungsschrift No. 16 21 478 (equivalent to British Pat. No. 1,230,447). This treatment achieves higher print runs and a reduced tendency to oxidation.

By way of the Examples which follow, the invention is explained in greater detail.

PRODUCTION OF A CONDENSATION PRODUCT ACCORDING TO THE INVENTION 750 g of acetic acid anhydride are first introduced into a 2 liter three-neck flask, then 260 g of benzophenone-2-carboxylic acid are stirred in. By heating to 50° C., a clear solution is obtained.

164 g of diethyl aniline are rapidly stirred into this solution, the mixture is heated to a boil and is refluxed for 5 hours (136° to 140° C.). Then the reaction mixture is stirred for another hour, during which time its temperature is reduced to about 60° C. Now the reaction mixture is stirred dropwise, within about 30 minutes, into an open vessel containing 5000 g of ice/water. The product is precipitated in the form of globular granules, which are sucked off, well rinsed with water and ground, if appropriate. Drying is performed at about 70° C. Yield: 342 g of raw product.

Melting point: 112° to 118° C.

PURIFICATION OF THE RAW PRODUCT

The raw product is recrystallized in 6 times its volume of ethanol and filtered. A product having the following specifications is obtained: Yield: 298 g (=83.5% of theoretical); melting point 120° to 121° C.; sensual test: colorless powder; analysis: calculated: 3.9% N, found 4.0% N.

EXAMPLE 1

An electrochemically roughened, anodically oxidized aluminum foil is mechanically coated with a solution of 18 g of 2,5-bis(4'-diethylaminophenyl)-1,3,4-oxadiazole and 27 g of a copolymer of styrene and maleic acid anhydride in 130 g of glycol monomethyl ether, 170 g of tetrahydofuran and 50 g of butyl acetate, to which 20 g of a solution, in methanol, of 0.9 of Astrazone Orange R (C.I. 48 040) and 0.09 g of Rhodamine FB (C.I. 45 170) have been added. The layer is dried in the dark and then charged, by means of a corona, to −650 V, as is diagrammatically shown in the attached FIGURE. After a residence time in the dark of 1 minute, the charge is measured again, and it is found that a discharge down to −284 V, i.e. 44% of the original charge, has taken place (curve 2 of the FIGURE). When the layer is exposed prior to charging by exposing it to a room illumination of 440 lux for 1 minute and is then charged under the same corona conditions as above, the achieved charge is only −370 V, i.e., 56% of the voltage of not pre-exposed layer. After storage of this charged layer in the dark for 1 minute, a charge of only −105 V, i.e., 28% of the original charge, is measured (curve 4 of the FIGURE). When ¼ of the quantity of 2,5-bis(4'-diethylaminophenyl)-1,3,4-oxidiazole employed for the coating solution is replaced by 4.5 g of a reaction product of 4'-methyl benzophenone-2-carboxylic acid and diethyl aniline and the layer is charged to −650 V by means of a corona after the evaporation of the solvent, it is found that after 1 minute the charge is only reduced to −350 V, i.e., 53% of the initial charge (curve 1 of the FIGURE). When, prior to charging, the layer is exposed to a room illumination of 440 lux for 1 minute and charging is then performed under the same conditions as above, a charge of −500 V, i.e., 75% of the charge of the not pre-exposed layer, is obtained. After one minute, the charge present on the pre-exposed and charged layer is −185 V, i.e., 37% of the original charge (curve 3 of the FIGURE).

The differences in the discharge under light of the two layers are low, so that both layers can be imaged in a process camera at identical exposure times and subsequently be processed to give lithographic printing forms. For this purpose, the photoconductive layer is charged to −450 V by mean of a corona and imagewise exposed in a process camera for 24 seconds, using four 1,000 W quartz halogen lamps. The latent charge image thus produced on the layer is developed with the aid of a magnetic roller and a commercially available electrophotographic developer. The developed image is fixed by heating to 180° C. for 2 minutes. Conversion into a printing form is effected by immersing the coated aluminum foil carrying the fixed toner image into a solution of 35 g of sodium metasilicate×9 H$_2$O in 140 g of glycerol having a water content of 20%, 550 ml of ethylene glycol and 140 ml of ethanol. After 1 minute, the photoconductor layer, which has dissolved in the toner-free areas, is rinsed off with a water jet under slight rubbing. A comparison of the printing form thus obtained with an analogously prepared printing form, the photoconductive layer of which does not contain the condensation product of this invention comprised of 4'-methylbenzophenone-2-carboxylic acid and diethyl aniline, shows that the resolution and the gradation of the screened image portions of the layer according to this invention are much better.

EXAMPLE 2

An aluminum foil, the surface of which has been mechanically roughened by means of a wire brush, is coated with a solution of 22.5 g of 2,5-bis(4'- diethylaminophenyl)-1,3,4-oxadiazole, 22.5 g of a copolymer of styrene and maleic acid anhydride, 1.125 g of Astrazone Orange R (C.I. 48 040) an 0.225 g of Brillant Green (C.I. 42 040), in 130 g of glycol monomethyl ether, 170 g of tetrahydrofuran and 50 g of butyl acetate, in a way such that after evaporation of the solvents a 5 μm thick layer is left. This layer is charged in the dark to −650 V by means of a corona. After a residence time in the dark of 1 minute, a charge of −295 V, i.e., 46% of the original charge, is measured. When the layer is first exposed to a room illumination of 440 lux for 1 minute and then charged under the same condition as the not pre-exposed layer, the charge obtained is −570 V, i.e., 89% of the charge obtained without pre-exposure. After a residence time in the dark of 1 minute, the charge is reduced to −205 V, i.e., 36% of the charge of the pre-exposed, charged layer. When 2/5 of the oxadiazole are replaced by 9 g of a condensation product of benzophenone-2-carboxylic acid and diethyl aniline and the layer is charged −650 V, the charge measured after a residence time of 1 minute in the dark is −405 V, i.e., 61% of the initial charge. After a pre-exposure under conditions as described above, the charge measured on the layer is −575 V, i.e., 91 % of the not pre-exposed layer. After 1 minute, this pre-exposed, charged layer still has a charge of −300 V, i.e., 52% of the original charge.

By substituting a part of the oxadiazole contained in the layer (reduction from 50% to 30%), the discharge under light of the layer is slightly affected. For this reason, the exposure time has to be increased by 20% for the processing of the layer which has been partly substituted by the condensation product. This is, however, no obstacle to the practical use of the layer. Due to the reduced discharge in the dark, the contrast of the developed image is substantially improved.

What is claimed is:

1. An electrophotographic recording material, comprising:
   (a) support layer; and
   (b) a photoconductive layer applied thereto, wherein the photoconductive layer comprises: an organic photoconductor; a binder; a sensitizer; and a condensation product of a benzophenone-2-carboxylic acid and a dialkyl aniline.

2. A recording material as in claim 1, wherein the photoconductive layer comprises a condensation product of benzophenone-2-carboxylic acid and diethyl aniline.

3. A recording material as in claim 1, wherein the photoconductive layer comprises a condensation product of 4'-methylbenzophenone-2-carboxylic acid and diethyl aniline.

4. A recording material as in claim 1, wherein the photoconductor comprises 2,5-bis(4'-dialkylaminophenyl)-1,3,4-oxadiazole.

5. A recording material as in claim 1, wherein the mixing ratio of organic photoconductor to condensation product is within a range of from about 1:1 to 1:5 parts by weight.

6. A recording material as in claim 1, wherein the sensitizer comprises a mixture of Astrazone Orange (R) (C.I. 48 040) and a Rhodamine dyestuff.

7. A recording material as in claim 1, wherein the sensitizer comprises a mixture of Astrazone Orange (R) (C.I. 48 040) and Brillant Green (C.I. 42 040).

8. A recording material as in claim 1, wherein the photoconductive layer has a thickness of from about 2 to 10 μm.

9. A recording material as in claim 1, wherein the photoconductive layer comprises an alkali-soluble binder.

10. A recording material as in claim 9, wherein the binder is a copolymer of styrene and maleic acid anhydride or phenol resin.

11. A recording material as in claim 1, wherein the dialkyl aniline comprises an alkyl group having from 1 to 4 carbon atoms.

12. A recording material as in claim 1, wherein the dialkyl aniline is dimethyl aniline or diethyl aniline.

13. A recording material as in claim 1, wherein the organic photoconductor comprises an oxadiazole derivative.

14. A recording material as in claim 1, wherein the sensitizer is present in a ratio of from about 0.001 to 0.1 parts by weight sensitizer per 1 part by weight photoconductor.

15. A recording material as in claim 1, wherein the binder is soluble in aqueous and alcoholic solvent systems.

16. A recording material as in claim 15, wherein the binder comprises a high-molecular substance with an alkali-solubilizing group.

17. A recording material as in claim 1, wherein the condensation product comprises an alkyl-substituted derivative of benzophenone-2-carboxylic acid and a dialkyl aniline.

18. A recording material as in claim 1, wherein the support comprises aluminum foil, and wherein the foil has been mechanically or electrochemically roughened.

* * * * *